United States Patent
Chiang et al.

(10) Patent No.: US 8,795,840 B2
(45) Date of Patent: Aug. 5, 2014

(54) COATED ARTICLE AND METHOD FOR MAKING THE SAME

(75) Inventors: Huann-Wu Chiang, New Taipei (TW); Cheng-Shi Chen, New Taipei (TW); Cong Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 152 days.

(21) Appl. No.: 13/287,310

(22) Filed: Nov. 2, 2011

(65) Prior Publication Data
US 2013/0029174 A1 Jan. 31, 2013

(30) Foreign Application Priority Data
Jul. 29, 2011 (CN) .......................... 2011 1 0215446

(51) Int. Cl.
*B32B 15/00* (2006.01)
(52) U.S. Cl.
USPC ............ 428/469; 428/336; 428/698; 428/704

(58) Field of Classification Search
USPC .......................... 428/336, 469, 472, 698, 704
See application file for complete search history.

(56) References Cited

U.S. PATENT DOCUMENTS

| 4,822,415 A | * | 4/1989 | Dorfman et al. | 420/61 |
| 6,767,419 B1 | * | 7/2004 | Branagan | 148/522 |
| 7,618,499 B2 | * | 11/2009 | Johnson et al. | 148/403 |

FOREIGN PATENT DOCUMENTS

| JP | 04-013860 | * | 1/1992 |
| JP | 2001-303218 | * | 10/2001 |
| JP | 2007-083692 | * | 4/2007 |

\* cited by examiner

*Primary Examiner* — Archene Turner
(74) *Attorney, Agent, or Firm* — Novak Druce Connolly Bove + Quigg LLP

(57) ABSTRACT

A coated article includes a substrate, an anti-corrosion layer formed on the substrate, and a decorative layer formed on the anti-corrosion layer. The anti-corrosion layer is an amorphous alloy layer containing elements of iron, chromium, boron and M, wherein M is one or more selected from the group consisting of phosphorus, carbon and silicon. A method for making the coated article is also described.

4 Claims, 2 Drawing Sheets ically vapor deposition (PVD) technology, the substrate often suffers galvanic corrosion due to the high potential difference between the layer and the substrate. Furthermore, the layer made by PVD will have tiny openings such as pinholes and cracks, which can accelerate the galvanic corrosion of the substrate.

Therefore, there is room for improvement within the art.

BRIEF DESCRIPTION OF THE FIGURE

Many aspects of the coated article and the method for making the coated article can be better understood with reference to the following drawings. The components in the drawings are not necessarily drawn to scale, the emphasis instead being placed upon clearly illustrating the principles of the coated article and the method. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
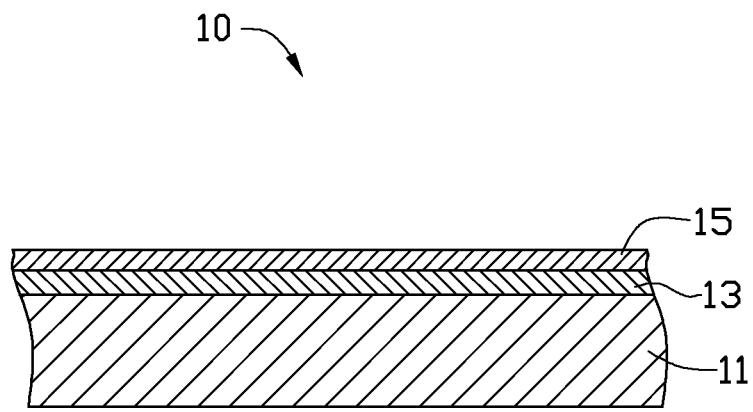
FIG. 1 is a cross-sectional view of an exemplary embodiment of a coated article.

FIG. 1 shows a coated article 10 according to an exemplary embodiment. The coated article 10 includes a substrate 11 and an anti-corrosion layer 13 formed on the substrate 11.

The substrate 11 is made of aluminum alloy or magnesium alloy.

The anti-corrosion layer 13 is an amorphous alloy layer, which contains elements of iron, chromium, boron and M, wherein M is one or more selected from the group consisting of phosphorus, carbon and silicon. The anti-corrosion layer 13 contains by atomic percentage, about 68% to about 72% of iron, about 8% to about 12% of chromium, about 10% to about 14% of boron, and about 2% to about 14% of M. The anti-corrosion layer 13 may be formed by a vacuum sputtering process. The anti-corrosion layer 13 has a thickness of about 800 nm to about 1200 nm.

The coated article 10 further includes a decorative layer 15 formed on the anti-corrosion layer 13. The decorative layer 15 is composed of a compound selected from the group consisting of carbide of titanium, chromium or zirconium, nitride of titanium, chromium or zirconium, and oxide of titanium, chromium or zirconium. The decorative layer 15 may be formed by a vacuum sputtering process. The decorative layer 15 has a thickness of about 400 nm to about 600 nm.

Figure 2:
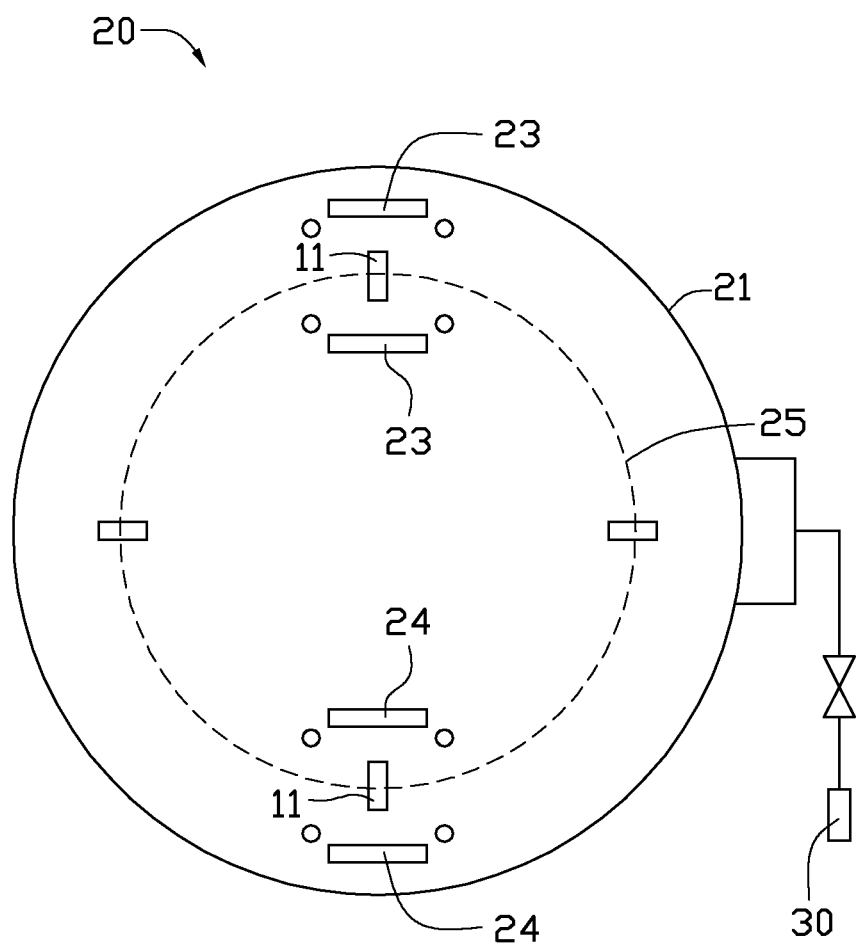
FIG. 2 is a schematic view of a vacuum sputtering device for fabricating the coated article in FIG. 1.

FIG. 2 shows a vacuum sputtering device 20, which includes a vacuum chamber 21 and a vacuum pump 30 connected to the vacuum chamber 21. The vacuum pump 30 evacuates the vacuum chamber 21. The vacuum chamber 21 has first targets 23, second targets 24 and a rotary rack (not shown) positioned therein. The rotary rack holding the substrate 11 revolves along a circular path 25, and the substrate 11 is also rotated about its own axis while being carried by the rotary rack. The first target contains about 68% to about 72% of iron, about 8% to about 12% of chromium, about 10% to about 14% of boron, and about 2% to about 14% of M by atomic percentage. The second target can be made of titanium, chromium or zirconium.

A method for making the coated article 10 may include the following steps:

The substrate 11 is pretreated. The pre-treating process may include wiping the surface of the substrate 11 with alcohol and deionized water, to remove impurities such as grease or dirt from the substrate 11. Then, the substrate 11 is dried.

The anti-corrosion layer 13 may be vacuum sputtered on the substrate 11. Vacuum sputtering of the anti-corrosion layer 13 is carried out in the vacuum chamber 21. The substrate 11 is positioned on the rotary rack. The vacuum chamber 21 is evacuated to about $8.0 \times 10^{-3}$ Pa and is heated to a temperature of about 100° C. to about 150° C. Argon gas (Ar) is used as the sputtering gas and is fed into the vacuum chamber 21 at a flow rate of about 150 sccm to about 300 sccm. The first targets 23 are supplied with electrical power of about 5 kw to about 10 kw. A negative bias voltage of about −50 V to about −300 V is applied to the substrate 11. Deposition of the anti-corrosion layer 13 takes a total of about 30 min to about 90 min. The anti-corrosion layer 13 contains about 68% to about 72% of iron, about 8% to about 12% of chromium, about 10% to about 14% of boron, and about 2% to about 14% of M by atomic percentage.

The decorative layer 15 is vacuum sputtered on the anti-corrosion layer 13. Vacuum sputtering of the decorative layer 15 is carried out in the vacuum chamber 21. The first targets 23 are powered off and the second targets 24 are supplied with electrical power of about 5 kw to about 8 kw. Nitrogen ($N_2$) is used as the reaction gas and is fed into the vacuum chamber 21 at a flow rate of about 60 sccm to about 150 sccm. The flow rate of argon, temperature of the vacuum chamber 21 and the negative bias voltage are the same as vacuum sputtering of the anti-corrosion layer 13. Deposition of the decorative layer 15 takes a total of about 20 min to about 40 min.

Example 1

The vacuum sputtering device 20 in example 1 was a medium frequency magnetron sputtering device.

The substrate 11 was made of magnesium alloy.

Sputtering to form the anti-corrosion layer 13 on the substrate 11 took place, wherein the vacuum chamber 21 was heated to a temperature of about 100° C. Ar was fed into the vacuum chamber 21 at a flow rate of about 180 sccm. The first targets 23 were supplied with a power of about 8 kw, and a negative bias voltage of about −75 V was applied to the substrate 11. Deposition of the anti-corrosion layer 13 took a total of about 45 min. The anti-corrosion layer 13 had a thickness of about 800 nm.

Sputtering to form the decorative layers 15 on the anti-corrosion layer 13 took place, wherein the second targets 24 were supplied with a power of about 8 kw. $N_2$ was fed into the vacuum chamber 21 at a flow rate of about 100 sccm. Other conditions were substantially the same as vacuum sputtering of the anti-corrosion layer 13. The deposition of the decorative layers 15 took a total of about 20 min. The decorative layers 15 had a thickness of about 600 nm.

Example 2

The vacuum sputtering device 20 in example 2 was the same in example 1.

The substrate 11 was made of aluminum alloy.

Sputtering to form the anti-corrosion layer 13 on the substrate 11 took place, wherein the vacuum chamber 21 was heated to a temperature of about 100° C. Ar was fed into the vacuum chamber 21 at a flow rate of about 250 sccm. The first targets 23 were supplied with a power of about 10 kw, and a negative bias voltage of about −100 V was applied to the substrate 11. Deposition of the anti-corrosion layer 13 took a total of about 45 min. The anti-corrosion layer 13 had a thickness of about 1200 nm.

Sputtering to form the decorative layers 15 on the anti-corrosion layer 13 took place, wherein the second targets 24 were supplied with a power of about 8 kw. $N_2$ was fed into the vacuum chamber 21 at a flow rate of about 120 sccm. Other conditions were substantially the same as vacuum sputtering of the anti-corrosion layer 13. The deposition of the decorative layers 15 took a total of about 20 min. The decorative layers 15 had a thickness of about 500 nm.

When the coated article 10 is in a corrosive environment, the anti-corrosion layer 13 and the substrate 11 will become cathode and anode of the galvanic corrosion respectively due to the high potential difference between the anti-corrosion layer 13 and the substrate 11. The anti-corrosion layer 13 quickly forms an oxide passivation layer in the galvanic corrosion process and protects the substrate 11 from further galvanic corrosion. Thus, the corrosion resistance of the coated article 10 is improved. The decorative layer 15 has stable properties and gives the coated article 10 a long lasting aesthetically pleasing appearance.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   a substrate being made of aluminum alloy or magnesium alloy;
   an anti-corrosion layer formed on the substrate, the anti-corrosion layer being an amorphous alloy layer and containing about 68% to about 72% of iron, about 8% to about 12% of chromium, about 10% to about 14% of boron, and about 2% to about 14% of M by atomic percentage; and
   a decorative layer directly formed on and contacting the anti-corrosion layer;
   wherein M being one or more selected from the group consisting of phosphorus, carbon and silicon.

2. The coated article as claimed in claim 1, wherein the anti-corrosion layer has a thickness of about 800 nm to about 1200 nm.

3. The coated article as claimed in claim 1, wherein the decorative layer is composed of a compound selected from the group consisting of carbide of titanium, chromium or zirconium, nitride of titanium, chromium or zirconium, and oxide of titanium, chromium or zirconium.

4. The coated article as claimed in claim 1, wherein the decorative layer has a thickness of about 400 nm to about 600 nm.

* * * * *